(12) United States Patent
Abouzied et al.

(10) Patent No.: US 11,063,617 B1
(45) Date of Patent: Jul. 13, 2021

(54) BANDTILT CORRECTION USING COMBINED SIGNAL AND IMAGE PASSIVE MIXERS

(71) Applicant: QUALCOMM Incorporated, San Diego, CA (US)

(72) Inventors: Mohamed Abouzied, La Jolla, CA (US); Ibrahim Ramez Chamas, Carlsbad, CA (US); Bhushan Shanti Asuri, San Diego, CA (US); Osama Elhadidy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/869,898

(22) Filed: May 8, 2020

(51) Int. Cl.
*H03D 7/10* (2006.01)
*H03D 7/12* (2006.01)
*H04B 1/00* (2006.01)
*H03F 3/21* (2006.01)

(52) U.S. Cl.
CPC ............ *H04B 1/0067* (2013.01); *H03D 7/10* (2013.01); *H03D 7/12* (2013.01); *H03F 3/21* (2013.01); *H03F 2200/451* (2013.01)

(58) Field of Classification Search
CPC .......... H04B 1/0067; H03D 7/12; H03F 3/21; H03F 2200/451
See application file for complete search history.

(56) References Cited

U.S. PATENT DOCUMENTS

| | | | |
|---|---|---|---|
| 7,266,357 B2* | 9/2007 | Behzad | H03D 7/1441 |
| | | | 455/192.2 |
| 8,571,510 B2* | 10/2013 | Liu | H04B 1/18 |
| | | | 455/313 |
| 9,369,261 B2* | 6/2016 | Furuta | H04L 5/143 |

\* cited by examiner

*Primary Examiner* — Dinh T Le
(74) *Attorney, Agent, or Firm* — Patterson+ Sheridan, L.L.P.

(57) ABSTRACT

Certain aspects provide a circuit for frequency conversion. The circuit includes first mixer circuitry coupled to a load circuit and having a first mixer configured to generate a first portion of a frequency-converted differential signal to be provided to the load circuit based on first differential input signals and second differential input signals, and a second mixer configured to generate a second portion of the frequency-converted differential signal based on third differential input signals and fourth differential input signals. The circuit also includes second mixer circuitry coupled to another load circuit and having a third mixer configured to generate a first portion of another frequency-converted differential signal based on the first differential input signals and the fourth differential input signals, and a fourth mixer configured to generate a second portion of the other frequency-converted differential signal based on the third differential input signals and the second differential input signals.

28 Claims, 12 Drawing Sheets

| LO and BB (Main Mixer) | Option 1 BB Signals (Image Mixer) | Option 2 BB Signals (Image Mixer) | Option 3 BB Signals (Image Mixer) | Option 4 BB Signals (Image Mixer) | Option 5 BB Signals (Image Mixer) | ... | Option N-1 BB Signals (Image Mixer) | Option N BB Signals (Image Mixer) |
|---|---|---|---|---|---|---|---|---|
| 0 | N-1 | N-2 | N-3 | N-4 | N-5 | ... | 1 | 0 |
| 1 | N-2 | N-3 | N-4 | N-5 | ... | ... | 0 | N-1 |
| ... | N-3 | N-4 | N-5 | ... | 1 | ... | N-1 | N-2 |
| N-5 | N-4 | N-5 | ... | 1 | 0 | ... | N-2 | ... |
| N-4 | N-5 | ... | 1 | 0 | N-1 | ... | ... | ... |
| N-3 | ... | 1 | 0 | N-1 | N-2 | ... | ... | ... |
| N-2 | 1 | 0 | N-1 | N-2 | N-3 | ... | 3 | 2 |
| N-1 | 0 | N-1 | N-2 | N-3 | N-4 | ... | 2 | 1 |

BANDTILT CORRECTION USING COMBINED SIGNAL AND IMAGE PASSIVE MIXERS

TECHNICAL FIELD

Certain aspects of the present disclosure generally relate to electronic circuits and, more particularly, to circuitry for frequency conversion.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more mixers for generating a frequency-converted signal. For example, a baseband signal may be upconverted to a radio-frequency (RF) signal for transmission, and a received RF signal may be downconverted to baseband for processing.

SUMMARY

Certain aspects provide a circuit for frequency conversion. The circuit includes first mixer circuitry coupled to a load circuit and having a first mixer configured to generate a first portion of a frequency-converted differential signal to be provided to the load circuit based on first differential input signals and second differential input signals, and a second mixer configured to generate a second portion of the frequency-converted differential signal based on third differential input signals and fourth differential input signals. The circuit also includes second mixer circuitry coupled to another load circuit and having a third mixer configured to generate a first portion of another frequency-converted differential signal based on the first differential input signals and the fourth differential input signals, and a fourth mixer configured to generate a second portion of the other frequency-converted differential signal based on the third differential input signals and the second differential input signals.

Certain aspects provide a method for frequency conversion. The method generally includes generating, via a first mixer of first mixer circuitry, a first portion of a frequency-converted differential signal based on first differential input signals and second differential input signals, generating, via a second mixer of the first mixer circuitry, a second portion of the frequency-converted differential signal based on third differential input signals and fourth differential input signals, and providing the first portion and the second portion of the frequency-converted differential signal to a load circuit. The method may also include generating, via a third mixer of second mixer circuitry, a first portion of another frequency-converted differential signal based on the first differential input signals and the fourth differential input signals, generating, via a fourth mixer of the second mixer circuitry, a second portion of the other frequency-converted differential signal based on the third differential input signals and the second differential input signals, and providing the first portion and the second portion of the other frequency-converted differential signal to another load circuit.

Certain aspects provide an apparatus for frequency conversion. The method generally includes means for generating a first portion of a frequency-converted differential signal based on first differential input signals and second differential input signals, means for generating a second portion of the frequency-converted differential signal based on third differential input signals and fourth differential input signals, and means for combining the first portion and the second portion of the frequency-converted differential signal and providing the frequency-converted differential signal to a load circuit. The apparatus may also include means for generating a first portion of another frequency-converted differential signal based on the first differential input signals and the fourth differential input signals, means for generating a second portion of the other frequency-converted differential signal based on the third differential input signals and the second differential input signals, and means for combining the first portion and the second portion of the other frequency-converted differential signal and providing the other frequency-converted differential signal to another load circuit.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 9 is a table illustrating various design options for BB signals input to an image mixer, in accordance with certain aspects of the present disclosure.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
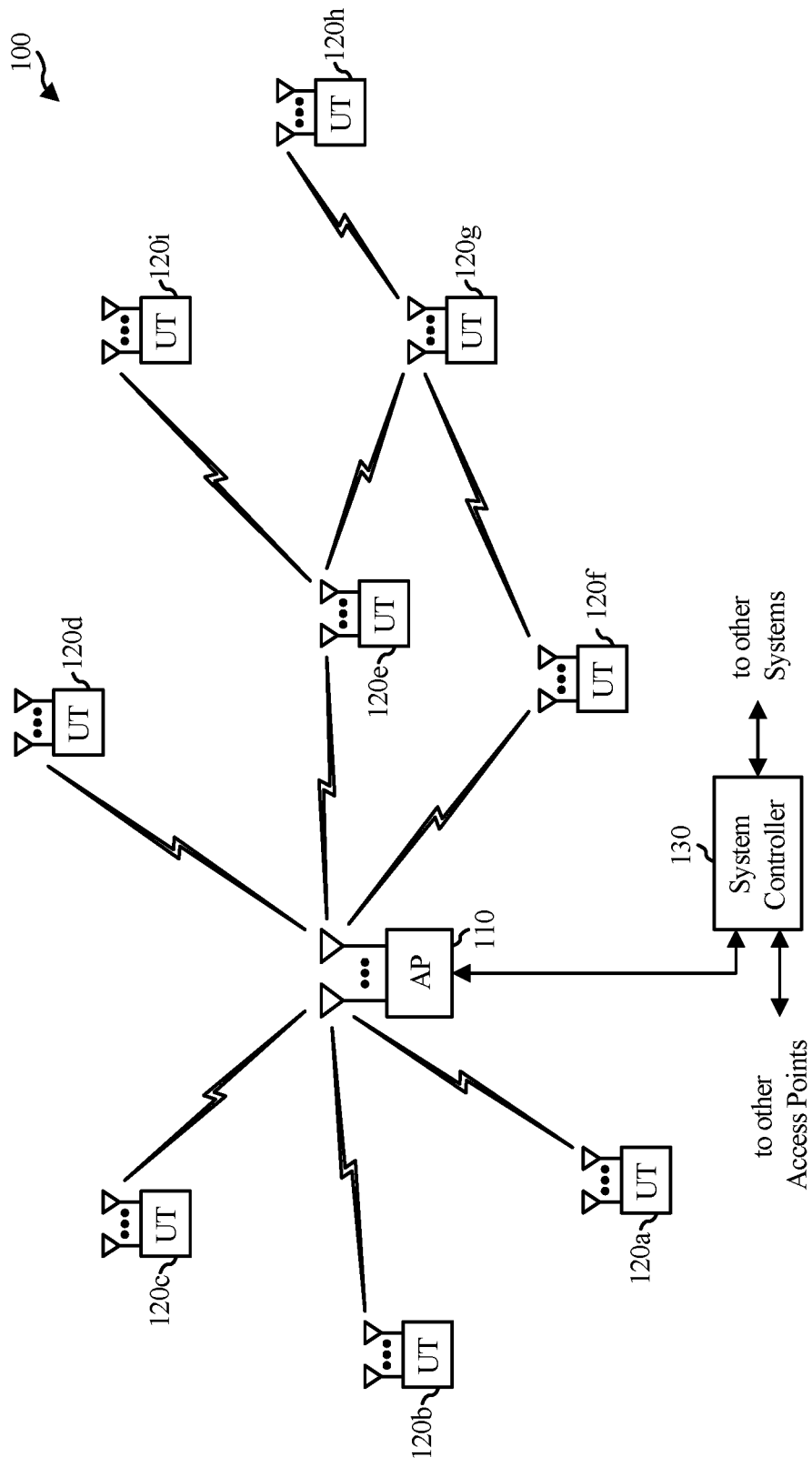
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include one or more mixers configured to provide a symmetrical frequency response, as described in more detail herein.

Figure 2:
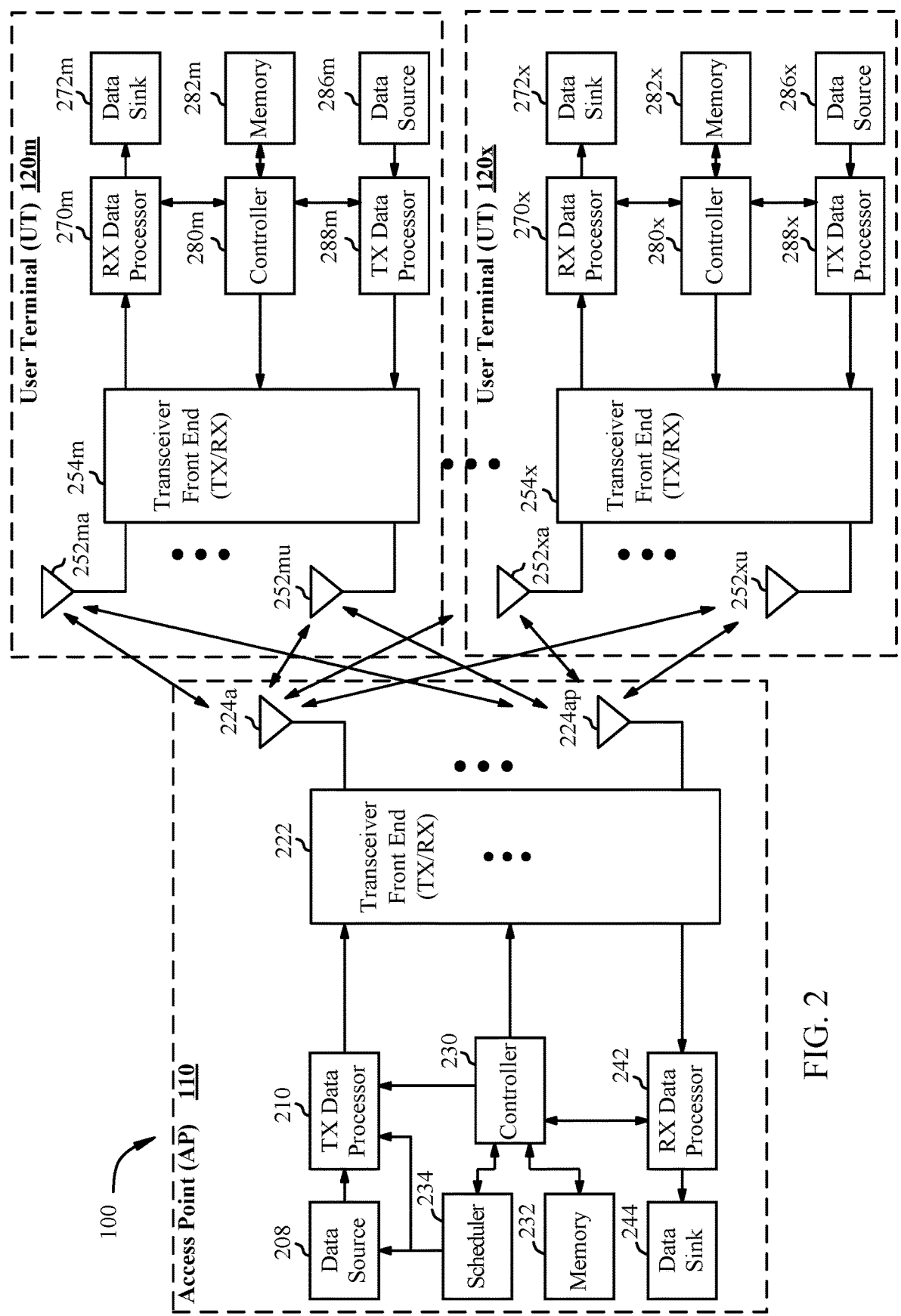
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{ap}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects, the transceiver front end (TX/RX) 222 of access point 110 and/or transceiver front end 254 of user terminal 120 may include one or more mixers configured to provide a symmetrical frequency response, as described in more detail herein.

On the downlink, at access point 110, a TX data processor 210 receives traffic data from a data source 208 for N dn user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the Nan user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
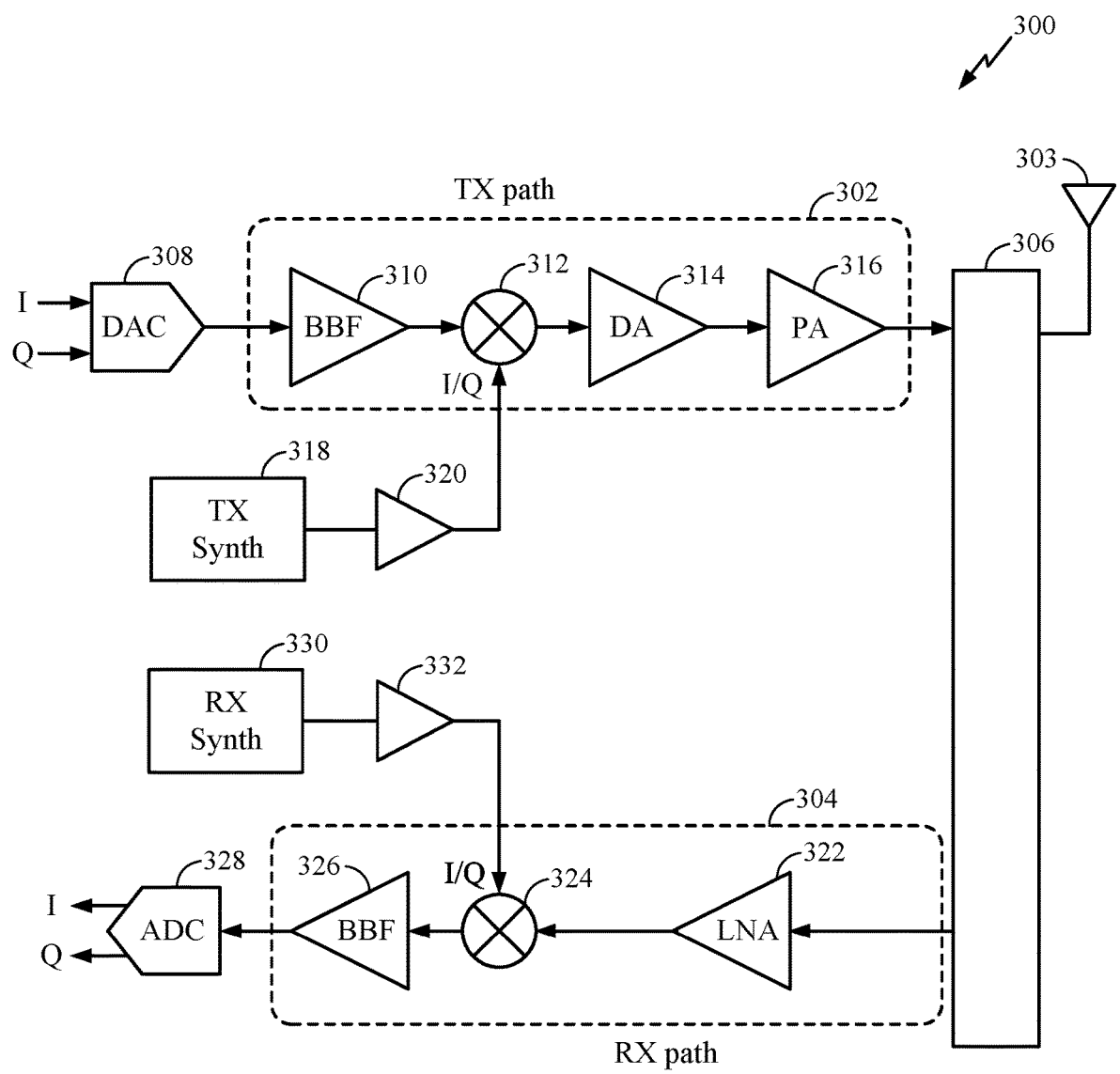
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303. In certain aspects, the mixer 312 may be configured to provide a symmetrical frequency response, as described in more detail herein The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 provide a wireless communication system as an example application in which certain aspects of the present disclosure may be implemented to facilitate understanding, certain aspects described herein may be used for upconversion and downconversion in any of various other suitable systems.

Example Techniques for Bandtilt Correction

Certain aspects of the present disclosure are generally directed to frequency conversion passive mixers (e.g., for upconversion or downconversion) configured to reduce bandtilt associated with radio-frequency (RF) outputs of the mixers. Transmitters use upconversion mixers to translate baseband (BB) signals to RF. Voltage-mode passive mixers provide a linear response. In some implementations, a harmonic rejection mixer may be used to reduce spurious tones by implementing BB or LO signals with different phases (e.g., lagging phases or leading phases). For example, BB signals and local-oscillator (LO) signals may be input to mixers having combined outputs. In some cases, delay between LO phases may be fixed (or lagging), and the delay between BB phases may vary (e.g., either lagging or leading), hence, giving either an upper side band (USB) or lower side band (LSB) operation for a transceiver, as described in more detail herein. BB signals provided to mixers with lagging phases may provide the USB, and BB signals provided to mixers with leading phases may provide the LSB.

Figure 4:
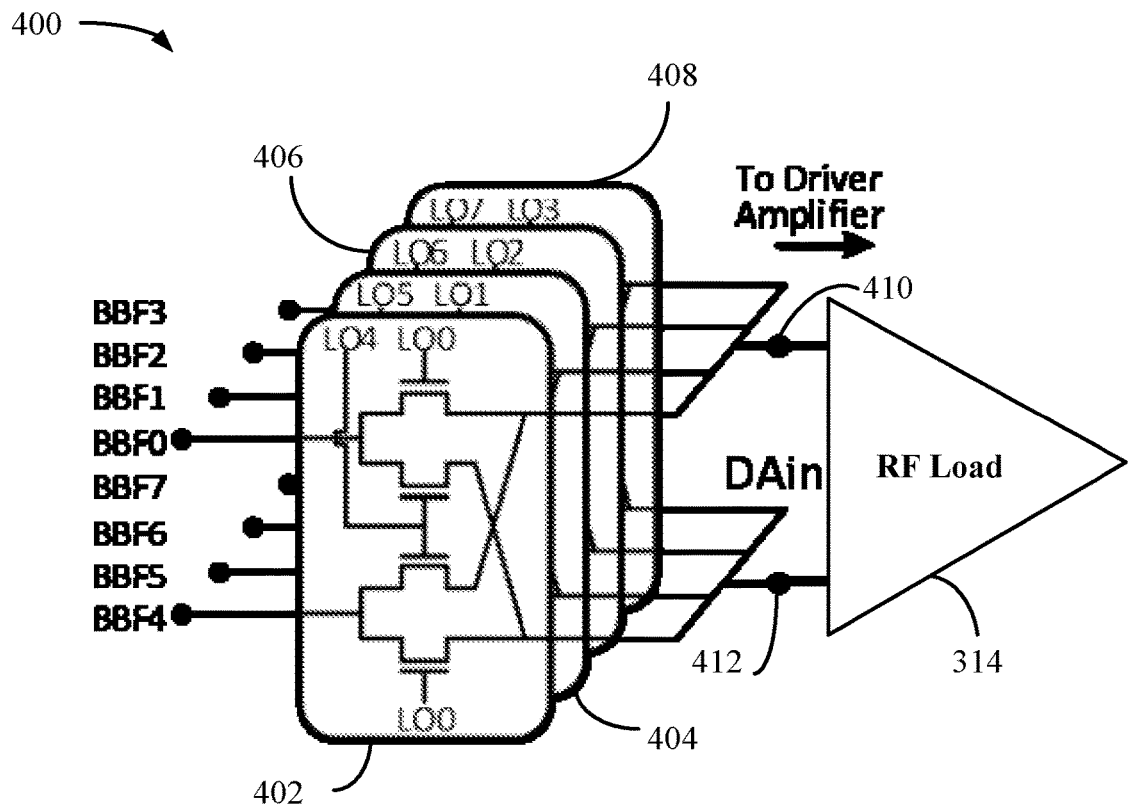
FIG. 4 illustrates example upconversion circuitry, in accordance with certain aspects of the present disclosure.

FIG. 4 illustrates example upconversion circuitry 400, in accordance with certain aspects of the present disclosure. As illustrated, the upconversion circuitry 400 includes mixers 402, 404, 406, 408 receiving BB frequency signals BBF0, BBF1, BBF2, BBF3, BBF4, BBF5, BBF6, and BBF7, and LO signals LO0, LO1, LO2, LO3, LO4, LO5, LO6, and LO7. For example, the mixer 402 may receive LO0 and LO4, as well as BBF0 and BBF4, the mixer 404 may receive LO1 and LO5, as well as BBF1 and BBF5, the mixer 406 may receive LO2 and LO6, as well as BBF2 and BBF6, and the mixer 408 may receive LO3 and LO7, as well as BBF7 and BBF3. First outputs (e.g., positive outputs) of mixers 402, 404, 406, 408 may be coupled to input node 410 of DA 314, and second outputs (e.g., negative outputs) of mixers 402, 404, 406, 408 may be coupled to input node 412 of DA 314. The input nodes 410, 412 may form a differential input pair of the DA 314. While the example upconversion circuitry 400 illustrates four mixers for upconversion to facilitate understanding, the aspects described herein are applicable to upconversion or downconversion using two or more mixers.

In some cases, the BB frequency signals BBF0, BBF1, BBF2, BBF3, BBF4, BBF5, BBF6, and BBF7 may have lagging phases. For example, the phase of BBF0 may lag the phase of BBF1, the phase of BBF1 may lag the phase of BBF2, and so on. In some cases, the LO signals LO0, LO1, LO2, LO3, LO4, LO5, LO6, and LO7 may have leading phases. For example, the phase of LO0 may lead the phase of LO1, and the phase of LO1 may lead the phase of LO2, and so on. In this manner, spurious tones associated with the upconversion circuitry may be reduced. However, passive mixers implemented in this manner may suffer from bandtilt over an operating frequency band, as described in more detail herein.

Figure 5:
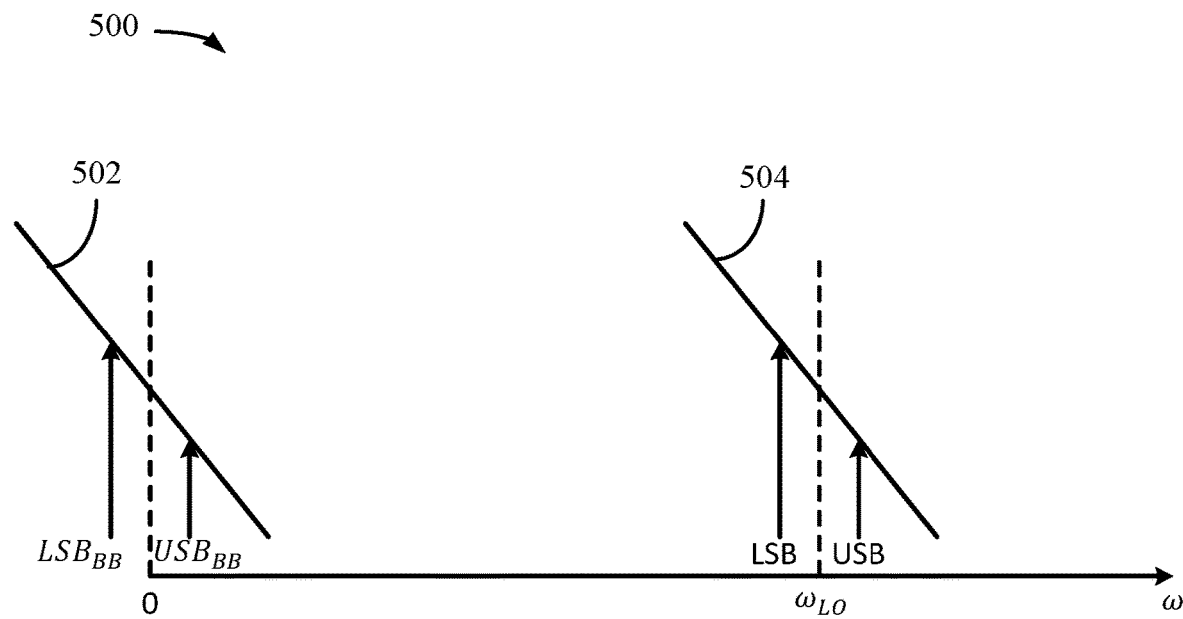
FIG. 5 is a graph illustrating bandtilt of impedance associated with baseband (BB) and radio-frequency (RF) signals.

FIG. 5 is a graph 500 illustrating bandtilt of impedance associated with BB and RF signals. The line 502 represents the impedance ($Z_{BB}$) associated with a BB signal, and the line 504 represents the impedance ($Z_{RF}$) associated with an RF signal. The RF signal is generated by upconverting the BB signal.

From a frequency-domain perspective, the mixer input impedance $Z_{BB}$ is a frequency-translated version of the RF impedance ($Z_{RF}$). An RF load capacitance (e.g., gate-to-source capacitance of a transistor of the DA 314) may result in $Z_{BB}$ having a complex capacitance, introducing an asymmetric transfer function around the RF frequency that results in bandtilt, as illustrated. In other words, for a capacitive load, the LSB impedance magnitude is larger than the USB impedance magnitude, in a case where phases of the LO signals are lagging each other as described in the example above. Without the complex impedance associated with $Z_{BB}$, the BB transfer function may correspond to a low-pass filter (LPF), and the BB signal may upconvert to a band-pass filter (BPF) that is symmetric around $\omega_{LO}$, $\omega_{LO}$ being the angular frequency associated with the LO frequency.

Certain aspects of the present disclosure provide an architecture using a parallel combination of signal and image mixers to reduce bandtilt. For example, the architecture described herein provides circuitry for frequency conversion that may provide a more symmetric frequency response than conventional implementations.

Figure 6:
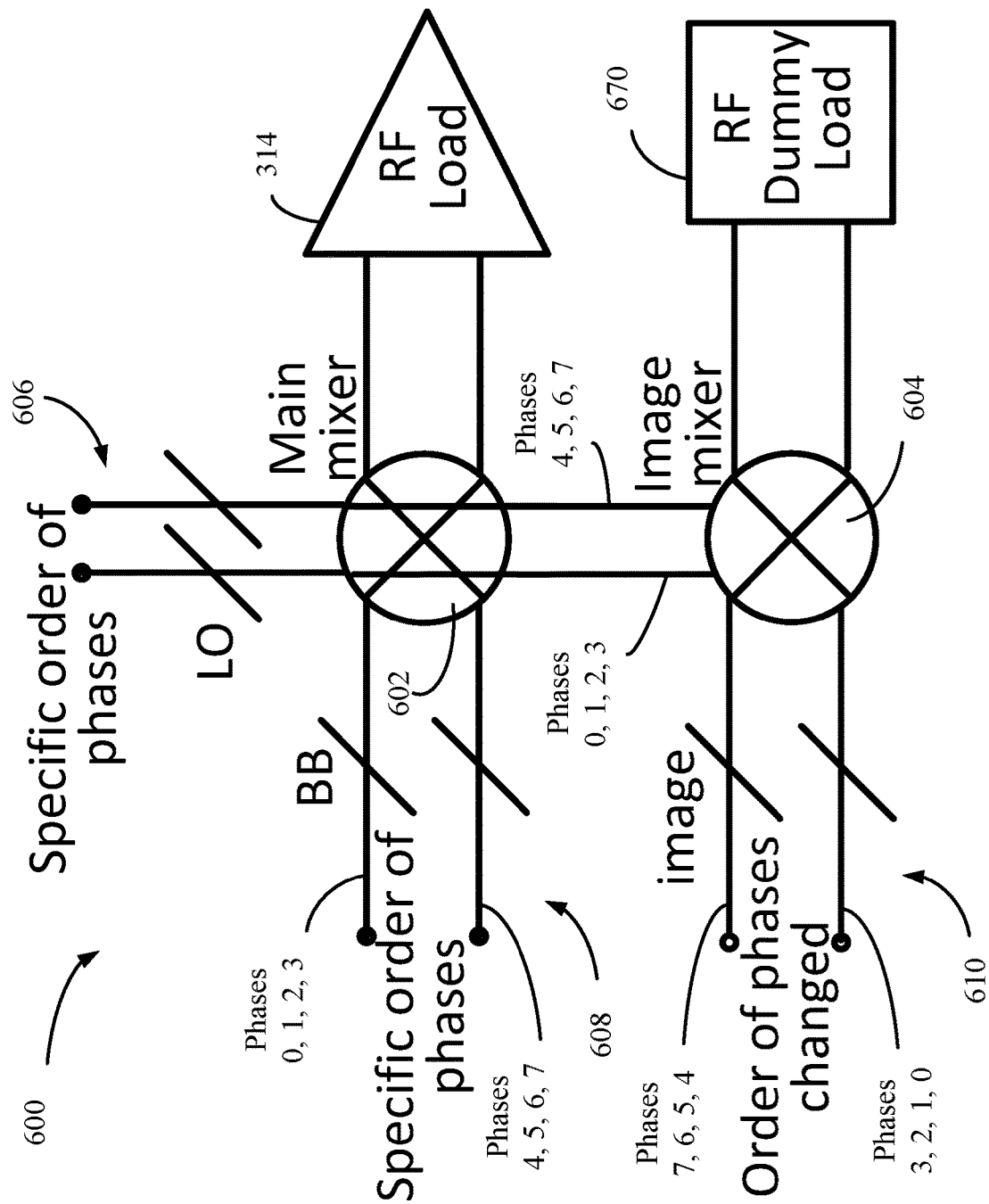
FIG. 6 illustrates upconversion circuitry using signal mixers and image mixers in parallel, in accordance with certain aspects of the present disclosure.

FIG. 6 illustrates upconversion circuitry 600 using signal mixers and image mixers in parallel, in accordance with certain aspects of the present disclosure. For example, the upconversion circuitry 600 includes a main mixer 602 (also referred to herein as a "signal mixer") and image mixer 604. The main mixer 602 may include mixers 402, 404, 406, 408, as described with respect to FIG. 4. As illustrated, LO signals 606 may be provided to both the main mixer 602 and the image mixer 604. The main mixer 602 receives BB signals 608, and the image mixer 604 receives BB signals 610. Each of the BB signals 610 may correspond to one of the BB signals 608, but in a different order. For example, the BB signals 608 may correspond to BBF0, BBF1, BBF2, BBF3, BBF4, BBF5, BBF6, BBF7 in sequence, and BB signals 610 may correspond to BBF7, BBF6, BBF5, BBF4, BBF3, BBF2, BBF1, BBF0 in sequence. As illustrated, the outputs of the mixer 604 may be coupled to an RF dummy load 670 via input nodes 672, 674. For example, an impedance of the RF dummy load 670 may be configured to match an impedance associated with the DA 314.

Figure 7:
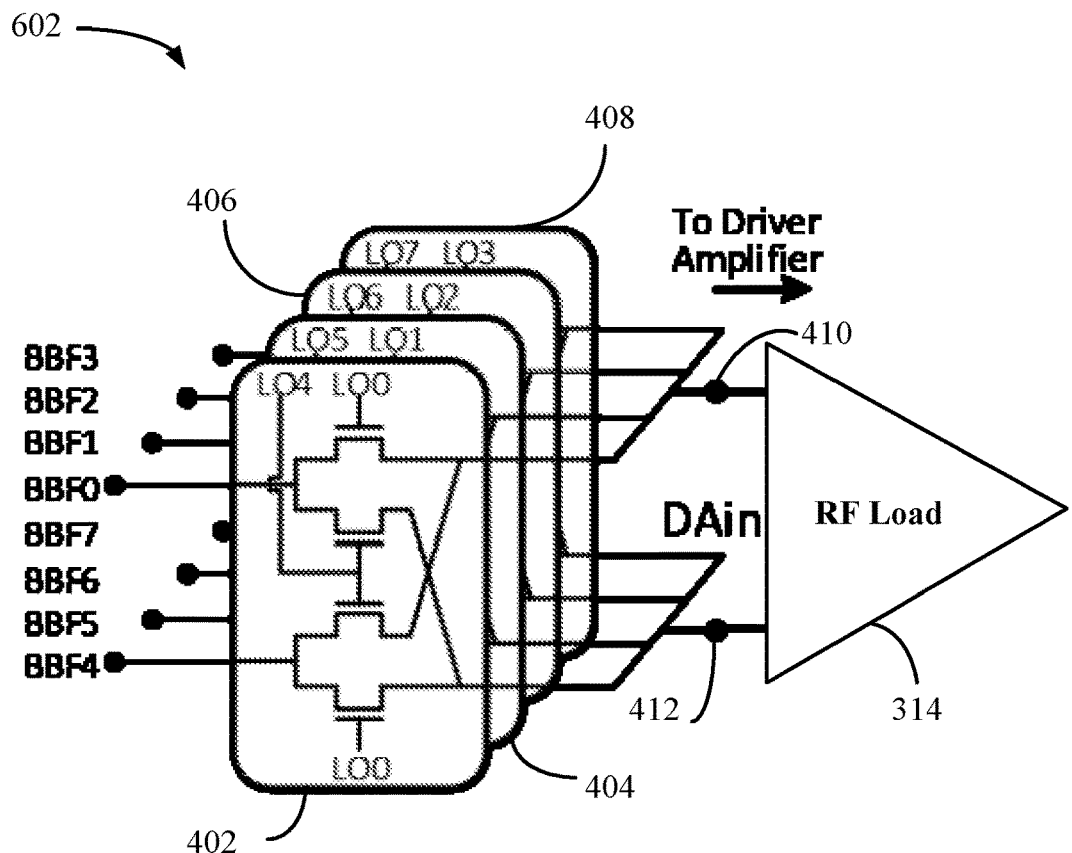
FIG. 7 illustrates a main mixer and an image mixer, in accordance with certain aspects of the present disclosure.
Figure 7:
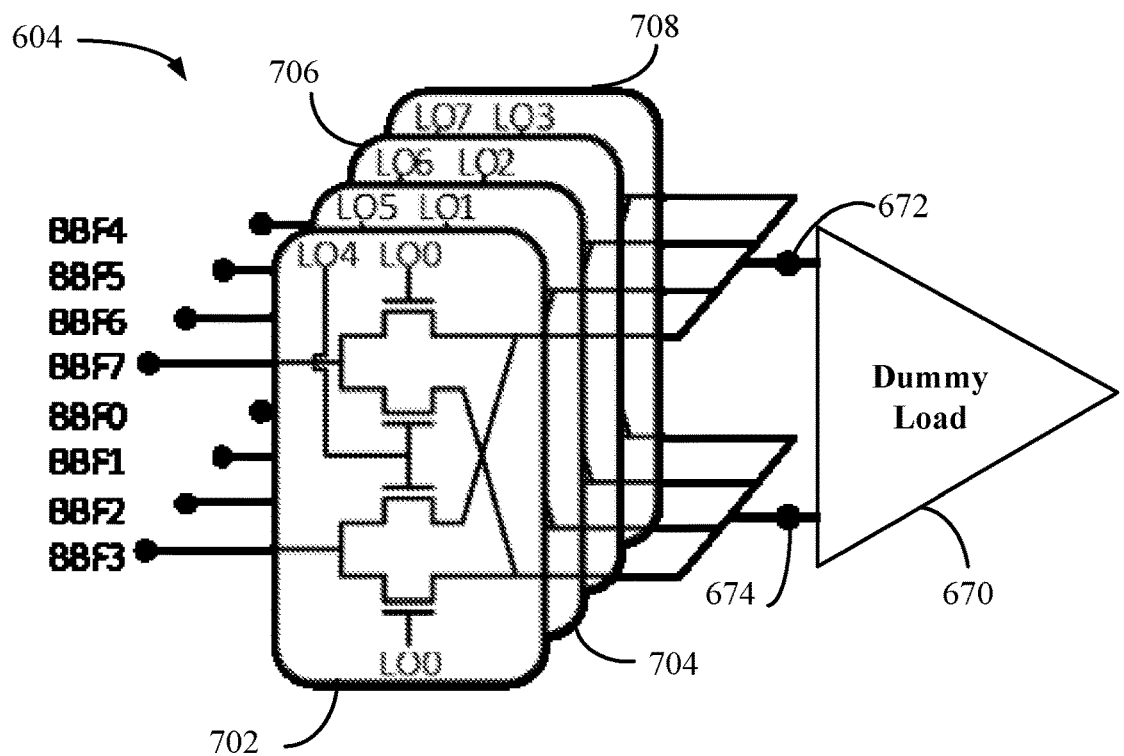

FIG. 7 illustrates the main mixer 602 and image mixer 604, in accordance with certain aspects of the present disclosure. As illustrated, the image mixer 604 may include mixers 702, 704, 706, 708. As illustrated, both mixers 402, 702 may receive LO0 and LO4, both mixers 404, 704 may receive LO1 and LO5, both mixers 406, 706 may receive LO2 and LO6, and both mixers 408, 708 may receive LO3 and LO7. The mixer 402 of the main mixer 602 may receive BBF0 and BBF4, the mixer 404 of the main mixer 602 may receive BBF1 and BBF5, the mixer 406 of the main mixer 602 may receive BBF2 and BBF6, and the mixer 408 of the main mixer 602 may receive BBF3 and BBF7.

As described, the mixer 604 may receive the same BB signals as mixer 602, but in a different order. For example, while mixers 402, 702 receive the same LO signals (LO0, LO4), the mixer 402 receives BBF0 and BBF4, and the mixer 702 receives BBF3 and BBF7. Moreover, the mixer 704 receives BBF2 and BBF6, the mixer 706 receives BBF1 and BBF5, and the mixer 708 receives BBF0 and BBF4.

Figure 8:
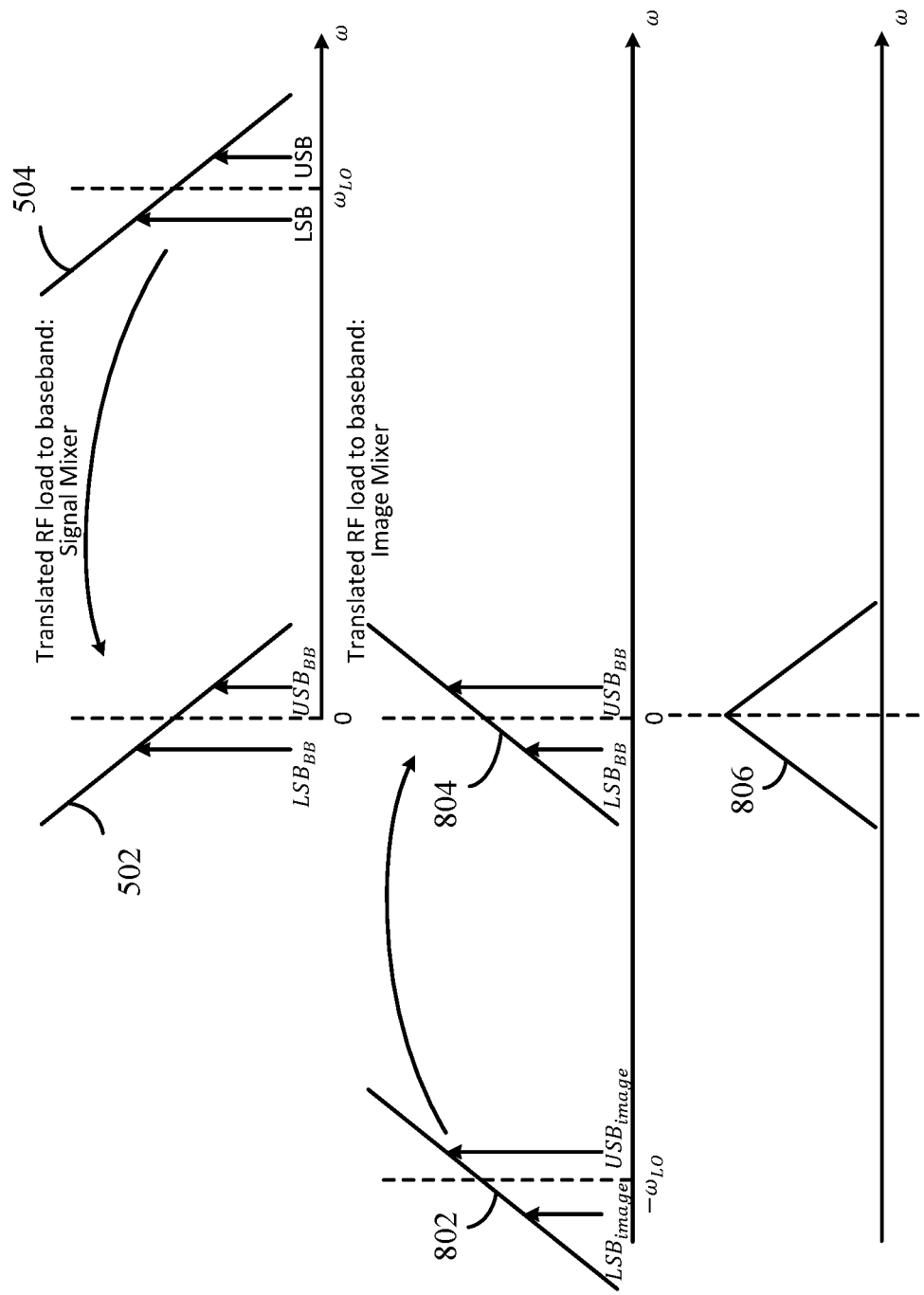
FIG. 8 illustrates impedance of BB and RF signals associated with main and image mixers, in accordance with certain aspects of the present disclosure.

FIG. 8 illustrates the impedance of BB and RF signals associated with main and image mixers, in accordance with certain aspects of the present disclosure. The line 502 represents the $Z_{BB}$ of the main mixer 602, and the line 504 represents $Z_{RF}$ of the main mixer 602. The RF load for the main mixer 602 is translated to BB, resulting in $Z_{BB}$ represented by line 502, as illustrated. Moreover, the line 802 represents $Z_{RF}$ of the image mixer 604, which may be translated to BB, resulting in $Z_{BB}$ of the image mixer 604 represented by line 804. As illustrated, $Z_{RF}$ of the image mixer 604 increases with respect to frequency, whereas $Z_{RF}$ of the main mixer decreases with respect to frequency. Therefore, $Z_{BB}$ resulting from the combination of the RF impedances of the image mixer and main mixer translated to BB results in a symmetrical BB impedance 806.

FIG. 9 is a table 900 illustrating various design options for BB signals input to the image mixer 604 where the number of different phases of the BB signals is N, N being an integer equal to or greater than 4, in accordance with certain aspects of the present disclosure. For example, as illustrated in table 900, if the BB signals provided to the main and image mixers have 8 different phases (N=8), a first option may include providing LO and BB signals in order from LO0 to LO7 and BBF0 to BBF7, and providing the BB signals to the image mixer in reverse order from BB7 to BBF0. As a second option, the BB signals may be provided to the image mixer in order of BBF6, BBF5, BBF4, BBF3, BBF2, BBF1, BBF0, and BBF7. As a third option, the BB signals may be provided to the image mixer in order of BBF5, BBF4, BBF3, BBF2, BBF1, BBF0, BBF6, and BBF7, and so on. In certain aspects, the change in the order of signals may be applied for the LO signals of the image mixer, while keeping the order of the BB signals provided to the image mixer and main mixer the same.

Figure 10:
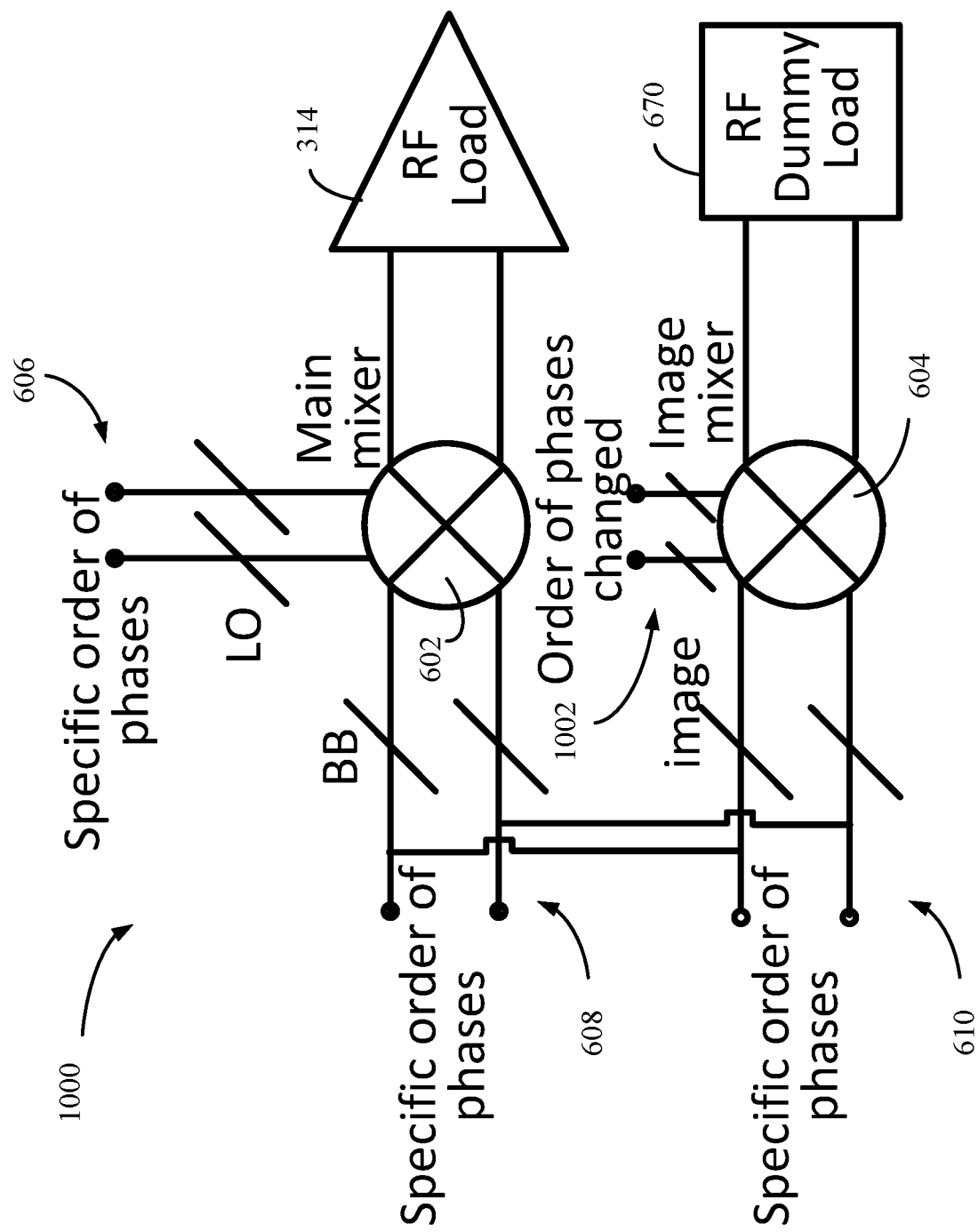
FIG. 10 illustrates upconversion circuitry with signal mixers and image mixers receiving local-oscillator (LO) signals in different orders, in accordance with certain aspects of the present disclosure.

FIG. 10 illustrates upconversion circuitry 1000 with signal mixers and image mixers receiving LO signals in different orders, in accordance with certain aspects of the present disclosure. As illustrated, the main mixer 602 may receive the LO signals 606, and the image mixer 604 may receive the LO signals 1002. The LO signals 1002 may correspond to the LO signals 606, but in a different order. The order of the BB signals provided to the main mixer 602 and the image mixer 604 may be the same, as illustrated.

Example Techniques for Reduction of Common-Mode Spurs

The techniques described herein for providing a symmetrical frequency response may result in common-mode spurs, which may be provided to the DA 314 and converted to a differential-mode four times modulation frequency (4FMOD) primary (4FMODP) signal at the output of the DA 314. 4FMODP refers to a signal at the LO frequency minus three times the BB frequency (LO-3BB). The differential-mode signal at 4FMODP may fall within a band protected by regulations, and should be reduced. Certain aspects of the present disclosure are directed to techniques for reducing common-mode spurs, resulting in reduction of the 4FMODP signal.

Figure 11:
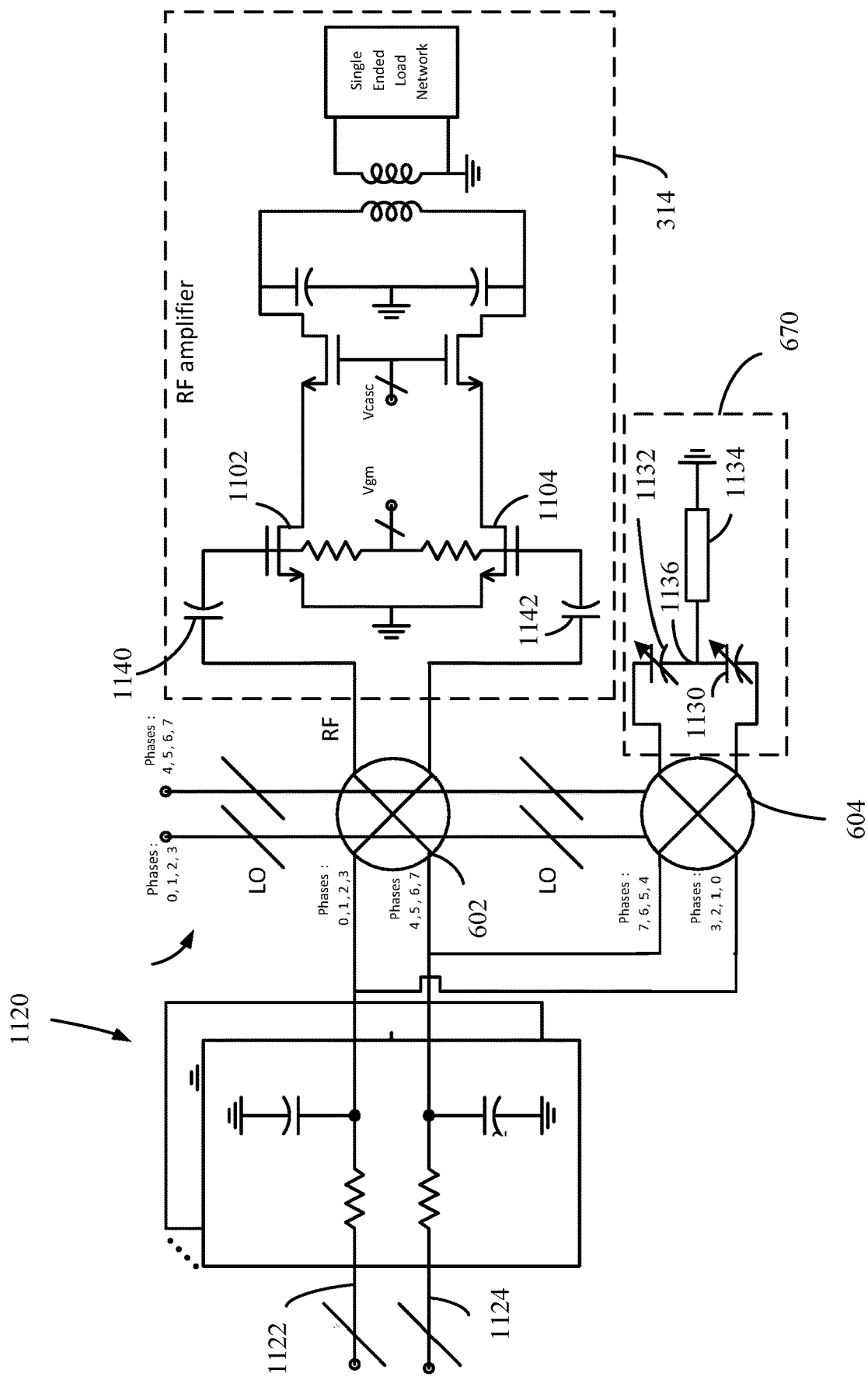
FIG. 11 illustrates upconversion circuitry coupled to a drive amplifier (DA) and a dummy load, in accordance with certain aspects of the present disclosure.

FIG. 11 illustrates upconversion circuitry 600 coupled to a DA and a dummy load, in accordance with certain aspects of the present disclosure. As illustrated, the RF load may be a DA 314 implemented with only n-type metal-oxide-semiconductor (NMOS) transistors. An NMOS-only DA consumes less power and area as compared to other types of DAs (e.g., a complementary metal-oxide-semiconductor (CMOS) DA). For example, the DA 314 may include an NMOS transistor 1102 having a gate coupled to an output of the mixer 602 (e.g., through alternating current (AC)-coupling capacitive element 1140), and an NMOS transistor 1104 having a gate coupled to another output of the mixer 602 (e.g., through AC-coupling capacitive element 1142).

As illustrated, the upconversion circuitry 600 may include filters 1120, each having a resistor-capacitor (RC) circuit, as illustrated. Each of the filters 1120 may receive positive and negative differential input signals 1122, 1124. The outputs of the filters 1120 are coupled to BB inputs of the main mixer 602 and the image mixer 604. As described herein, the BB signals may be provided to the main mixer 602 and image mixer 604 in different orders to provide a symmetric frequency response. For example, the input impedances to the main mixer 602 and the image mixer 604 may be the same when operating on the LSB of the BB ($LSB_{BB}$) and the USB of BB ($USB_{BB}$).

As described, certain aspects of the present disclosure are directed to techniques for reducing common-mode spurs, resulting in reduction of the 4FMODP signal. For example, the dummy load 670 may be implemented as a common-mode trap circuit for rejecting common-mode spurs at a residual sideband (RSB) of the upconversion circuitry. That is, the dummy load 670 may include capacitive elements 1130, 1132 coupled to respective output nodes of the image mixer 604. In certain aspects, a node 1136 between the capacitive elements 1130, 1132 may be floating. In other words, first terminals of the capacitive elements 1130, 1132 may be coupled to respective output nodes of the image mixer 604, whereas second terminals of the capacitive elements may be coupled together at node 1136. In other aspects, the node between the capacitive elements 1130, 1132 may be coupled to a reference potential node (e.g., electric ground) through an impedance element 1134 with a relatively large impedance. The impedance element 1134 may be implemented, for example, using a resistive element, an inductive element, or both a resistive element and an inductive element.

In certain aspects, each of the capacitive elements 1130, 1132 may be implemented via a transistor. The bulk of the transistors may be coupled to node 1136 and floating or coupled to electric ground through impedance element 1134, to form a common-mode trap. The impedance element 1134 may facilitate biasing for the transistors implementing the capacitive elements 1130, 1132.

Figure 12:
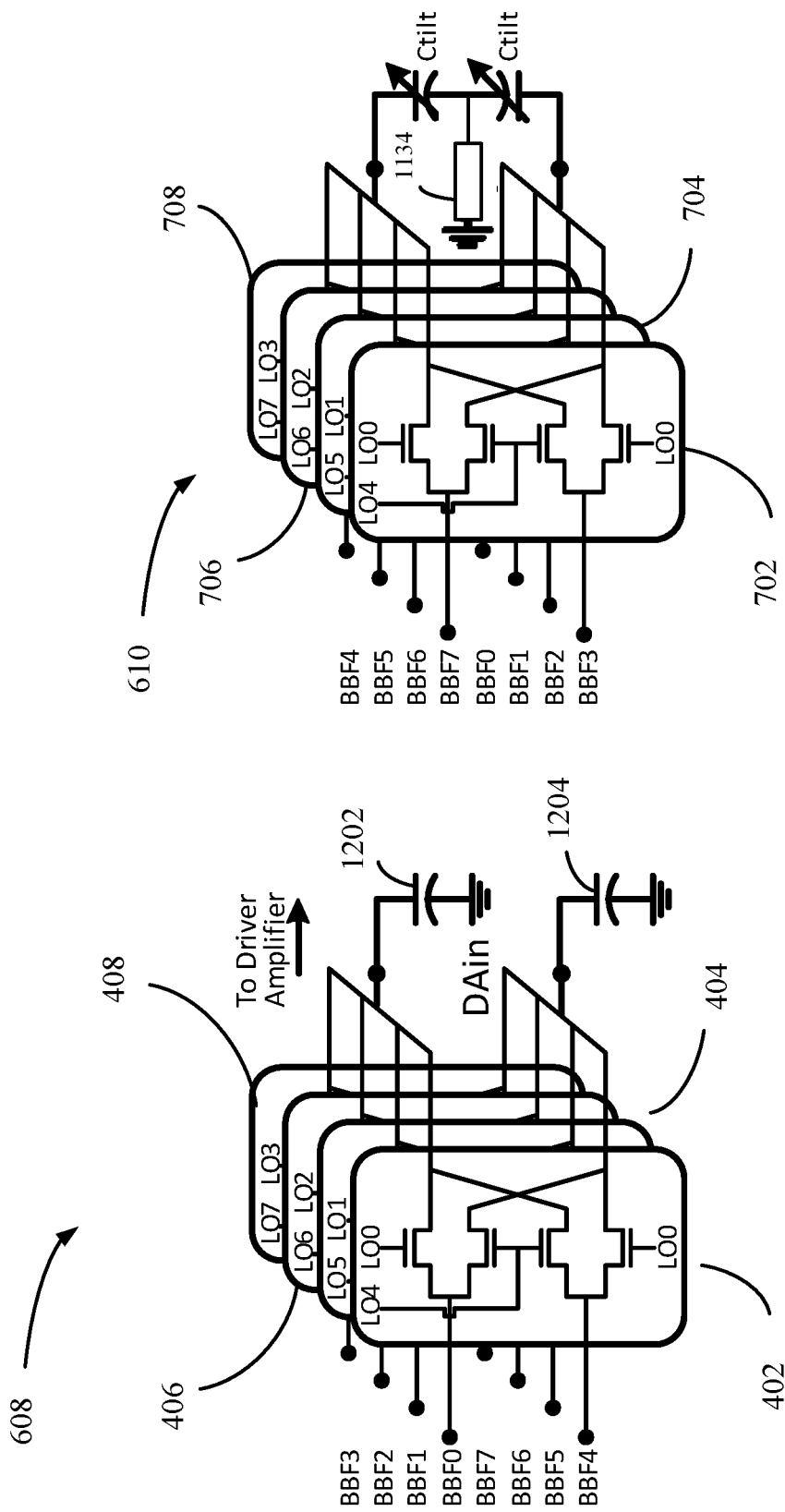
FIG. 12 illustrates the upconversion circuitry coupled to capacitive elements associated with a DA, in accordance with certain aspects of the present disclosure.

FIG. 12 illustrates the upconversion circuitry 600 coupled to capacitive elements 1202, 1204 associated with the DA 314, in accordance with certain aspects of the present disclosure. For example, the capacitive element 1202 may correspond to the gate-to-source capacitance of transistor 1102, and the capacitive element 1204 may correspond to the gate-to-source capacitance of transistor 1104. As illustrated, the outputs of the upconversion circuitry 600 are coupled to capacitive elements 1130, 1132 (labeled "Ctilt"). The node between the capacitive elements 1130, 1132 may be coupled to electric ground through impedance element 1134, as described herein.

Figure 13:
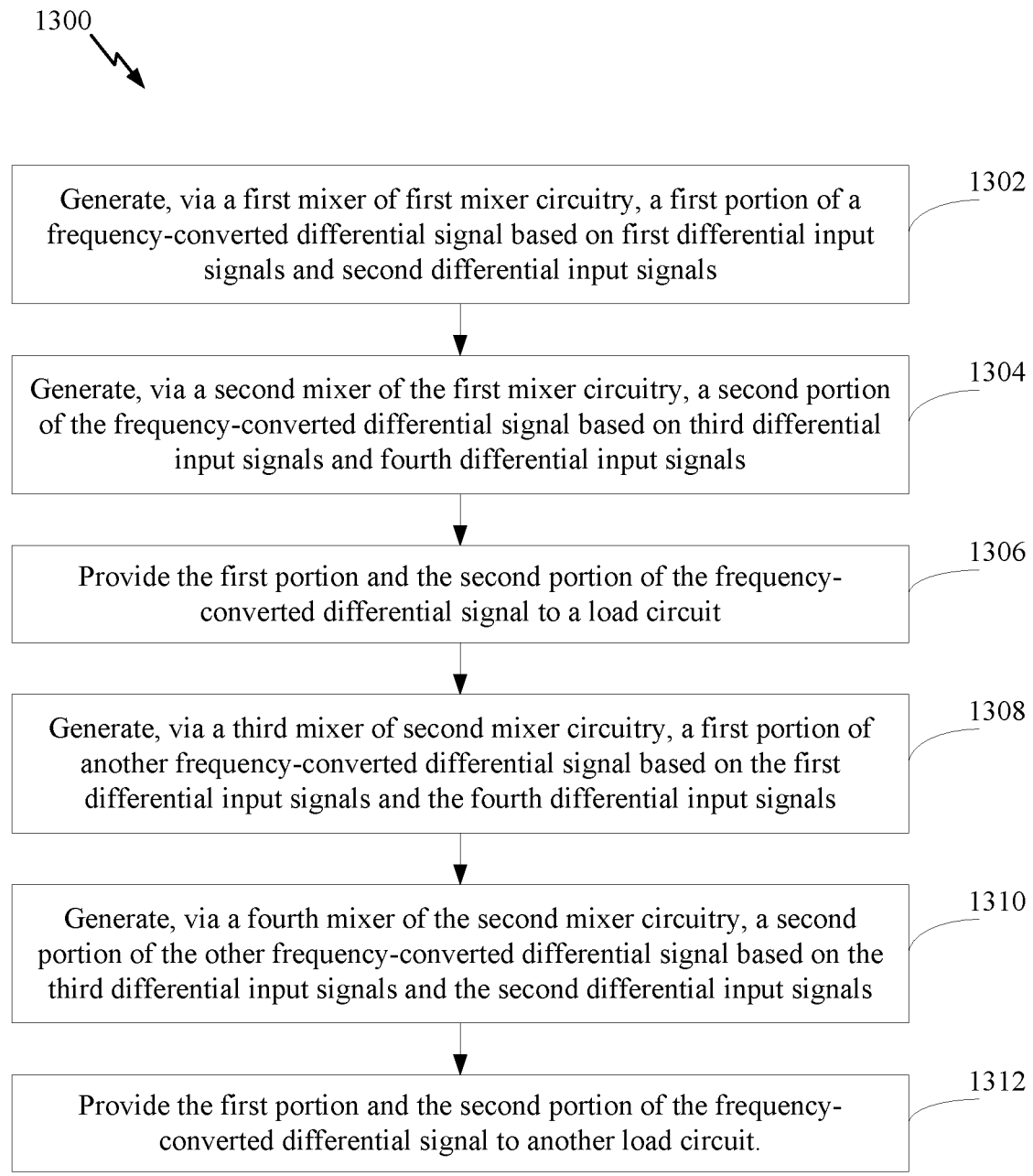
FIG. 13 is a flow diagram illustrating example operations for frequency conversion, in accordance with certain aspects of the present disclosure.

FIG. 13 is a flow diagram illustrating example operations 1300 for frequency conversion, in accordance with certain aspects of the present disclosure. The operations 1300 may be performed by a circuit, such as the upconversion circuitry 600.

The operations 1300 begin, at block 1302, with the circuit generating, via a first mixer (e.g., mixer 402) of first mixer circuitry (e.g., main mixer 602), a first portion of a frequency-converted differential signal (e.g., at input node 410) based on first differential input signals (e.g., LO0 and LO4) and second differential input signals (e.g., BBF0 and BBF4). At block 1304, the circuit may generate, via a second mixer (e.g., mixer 408) of the first mixer circuitry, a second portion of the frequency-converted differential signal based on third differential input signals (e.g., LO3 and LO7) and fourth differential input signals (e.g., BBF3 and BBF7). At block 1306, the circuit combines the first portion and the second portion of the frequency-converted differential signal and provides the frequency-converted differential signal to a load circuit (e.g., DA 314).

In certain aspects, a phase of a first input signal of the second differential input signals is lagging (or leading) a phase of a first input signal of the fourth differential input signals, and a phase of a second input signal of the second differential input signals is lagging (or leading) a phase of a second input signal of the fourth differential input signals.

At block 1308, the circuit may generate, via a third mixer (e.g., mixer 702) of second mixer circuitry (e.g., image mixer 604), a first portion of another frequency-converted differential signal based on the first differential input signals (e.g., LO0 and LO4) and the fourth differential input signals (e.g., BBF7 and BBF3), and at block 1310, generate, via a fourth mixer (e.g., mixer 708) of the second mixer circuitry, a second portion of the other frequency-converted differential signal based on the third differential input signals (e.g., LO3 and LO7) and the second differential input signals (e.g., BBF4 and BBF0). For example, the third mixer may be configured to generate the first portion of the other frequency-converted differential signal based on an inverse (e.g., in inverse order) of the fourth differential input signals for the second mixer, and the fourth mixer is configured to generate the second portion of the other frequency-converted differential signal based on an inverse of the second differential input signals for the first mixer. At block 1312, the circuit combines the first portion and the second portion of the other frequency-converted differential signal and provides the other frequency-converted differential signal to another load circuit (e.g., dummy load 670).

In certain aspects, the first differential input signals (e.g., BBF0 and BBF4) and the third differential input signals (e.g., BBF3 and BBF7) are frequency converted to generate the frequency-converted differential signal, the second differential input signals (e.g., LO0 and LO4) and the fourth differential input signals (e.g., LO3 and LO7) being differential LO signals. In other aspects, the second differential input signals (e.g., BBF0 and BBF4) and the fourth differential input signals (e.g., BBF3 and BBF7) are frequency converted to generate the frequency-converted differential signal, the first differential input signals (e.g., LO0 and LO4) and the third differential input signals (e.g., LO3 and LO7) being differential LO signals. For example, the first differential input signals and the third differential input signals may be BB signals, and the second differential input signals and the fourth differential input signals may be differential LO signals. As another example, the second differential input signals and the fourth differential input signals may be BB signals, and the first differential input signals and the third differential input signals may be LO signals.

In certain aspects, the load circuit may be a main load circuit and the other load circuit may be a dummy load circuit. The main load circuit may be a drive amplifier (DA).

In certain aspects, the circuit may also generate, via a fifth mixer (e.g. mixer 404) of the first mixer circuitry, a third portion of the frequency-converted differential signal based on fifth differential input signals (e.g., LO1 and LO5) and sixth differential input signals (e.g., BBF1 and BBF5) and generate, via a sixth mixer (e.g., mixer 406) of the first mixer circuitry, a fourth portion of the frequency-converted differential signal based on seventh differential input signals (e.g., LO2 and LO6) and eighth differential input signals (e.g., BBF2 and BBF6). The circuit may combine the third portion and the fourth portion with the first portion and the second portion of the frequency-converted differential signal and provide the frequency-converted differential signal to the load circuit.

In certain aspects, the circuit generates, via a seventh mixer (e.g., mixer 704) of the second mixer circuitry, a third portion of the other frequency-converted differential signal based on the fifth differential input signals (e.g., LO1 and LO5) and the eighth differential input signals (e.g., BBF6 and BBF2), and generate, via an eighth mixer (e.g., mixer 706) of the second mixer circuitry, a fourth portion of the other frequency-converted differential signal based on the seventh differential input signals (e.g., LO2 and LO6) and the sixth differential input signals (e.g., BBF5 and BBF1). The circuit may combine the third portion and the fourth portion with the first portion and the second portion of the other frequency-converted differential signal before providing the other frequency-converted differential signal to the other load circuit.

In certain aspects, the other load circuit may include a first capacitive element (e.g., capacitive element 1130) coupled to a first output of the second mixer circuitry, and a second capacitive element (e.g., capacitive element 1132) coupled to a second output of the second mixer circuitry. In some cases, a node between the first capacitive element and the second capacitive element is electrically floating. In some cases, the other load circuit may include an impedance element, where a node between the first capacitive element and the second capacitive element is coupled to a reference potential node (e.g., electric ground) of the circuit through the impedance element.

In certain aspects, the circuit may further amplify, via an amplifier (e.g., DA 314), the frequency-converted differential signal, the amplifier having a first transistor (e.g., transistor 1102) coupled to a first output of the first mixer circuitry and a second transistor (e.g., transistors 1104) coupled to a second output of the first mixer circuitry. In certain aspects, the first capacitive element has a first capacitance corresponding to a gate-to-source capacitance of the first transistor, and the second capacitive element has a second capacitance corresponding to a gate-to-source capacitance of the second transistor.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering. For example, means for generating may include a mixer, such as the mixers 402, 404, 406, 408, 702, 704, 706, 708. Means for combining (and providing) may include a node with multiple branches (e.g., a summing node), such as the input nodes 410, 412, 672, 674.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A circuit for frequency conversion, comprising:
    first mixer circuitry coupled to a load circuit and having:
        a first mixer configured to generate a first portion of a frequency-converted differential signal to be provided to the load circuit based on first differential input signals and second differential input signals; and
        a second mixer configured to generate a second portion of the frequency-converted differential signal to be provided to the load circuit based on third differential input signals and fourth differential input signals; and
    second mixer circuitry coupled to another load circuit and having:
        a third mixer configured to generate a first portion of another frequency-converted differential signal to be provided to the other load circuit based on the first differential input signals and the fourth differential input signals, wherein the third mixer is configured to generate the first portion of the other frequency-converted differential signal based on an inverse of the fourth differential input signals for the second mixer; and
        a fourth mixer configured to generate a second portion of the other frequency-converted differential signal to be provided to the other load circuit based on the third differential input signals and the second differential input signals, wherein the fourth mixer is configured to generate the second portion of the other frequency-converted differential signal based on an inverse of the second differential input signals for the first mixer.

2. The circuit of claim 1, wherein:
    a phase of a first input signal of the second differential input signals is configured to lag a phase of a first input signal of the fourth differential input signals; and
    a phase of a second input signal of the second differential input signals is configured to lag a phase of a second input signal of the fourth differential input signals.

3. The circuit of claim 1, wherein:
    a phase of a first input signal of the second differential input signals is configured to lead a phase of a first input signal of the fourth differential input signals; and
    a phase of a second input signal of the second differential input signals is configured to lead a phase of a second input signal of the fourth differential input signals.

4. The circuit of claim 1, wherein the first differential input signals and the third differential input signals are frequency converted to generate the frequency-converted differential signal, the second differential input signals and the fourth differential input signals comprising differential local-oscillator (LO) signals.

5. The circuit of claim 1, wherein the second differential input signals and the fourth differential input signals are frequency converted to generate the frequency-converted differential signal, the first differential input signals and the third differential input signals comprising differential local-oscillator (LO) signals.

6. The circuit of claim 1, wherein:
    the first differential input signals and the third differential input signals comprise baseband (BB) signals and the second differential input signals and the fourth differential input signals comprise differential local-oscillator (LO) signals; or
    the second differential input signals and the fourth differential input signals comprise BB signals and the first differential input signals and the third differential input signals comprise LO signals.

7. A circuit for frequency conversion, comprising:
    first mixer circuitry coupled to a load circuit and having:
        a first mixer configured to generate a first portion of a frequency-converted differential signal to be provided to the load circuit based on first differential input signals and second differential input signals; and
        a second mixer configured to generate a second portion of the frequency-converted differential signal based on third differential input signals and fourth differential input signals; and
    second mixer circuitry coupled to another load circuit and having:
        a third mixer configured to generate a first portion of another frequency-converted differential signal based on the first differential input signals and the fourth differential input signals; and
        a fourth mixer configured to generate a second portion of the other frequency-converted differential signal based on the third differential input signals and the second differential input signals, wherein the load circuit comprises a main load circuit and wherein the other load circuit comprises a dummy load circuit.

8. The circuit of claim 7, wherein the main load circuit comprises a drive amplifier (DA).

9. The circuit of claim 1, wherein:
    the first mixer circuitry further comprises:
        a fifth mixer configured to generate a third portion of the frequency-converted differential signal to be provided to the load circuit based on fifth differential input signals and sixth differential input signals; and
        a sixth mixer configured to generate a fourth portion of the frequency-converted differential signal based on seventh differential input signals and eighth differential input signals; and
    the second mixer circuitry further comprises:
        a seventh mixer configured to generate a third portion of the other frequency-converted differential signal to be provided to the other load circuit based on the fifth differential input signals and the eighth differential input signals; and an eighth mixer configured to generate a fourth portion of the other frequency-converted differential signal based on the seventh differential input signals and the sixth differential input signals.

10. The circuit of claim 1, wherein the other load circuit comprises:
a first capacitive element having a first terminal coupled to a first output of the second mixer circuitry; and
a second capacitive element having a first terminal coupled to a second output of the second mixer circuitry.

11. The circuit of claim 10, wherein a node coupled to a second terminal of the first capacitive element and to a second terminal of the second capacitive element is electrically floating.

12. The circuit of claim 10, wherein the other load circuit further comprises an impedance element, the impedance element being coupled between a reference potential node of the circuit and a node coupled to a second terminal of the first capacitive element and to a second terminal of the second capacitive element.

13. The circuit of claim 12, wherein the impedance element comprises at least one of a resistive element or an inductive element.

14. The circuit of claim 10, wherein:
the load circuit comprises an amplifier having a first transistor coupled to a first output of the first mixer circuitry and a second transistor coupled to a second output of the first mixer circuitry;
the first capacitive element has a first capacitance corresponding to a gate-to-source capacitance of the first transistor; and
the second capacitive element has a second capacitance corresponding to a gate-to-source capacitance of the second transistor.

15. A method for frequency conversion, comprising:
generating, via a first mixer of first mixer circuitry, a first portion of a frequency-converted differential signal based on first differential input signals and second differential input signals;
generating, via a second mixer of the first mixer circuitry, a second portion of the frequency-converted differential signal based on third differential input signals and fourth differential input signals;
providing the first portion and the second portion of the frequency-converted differential signal to a load circuit;
generating, via a third mixer of second mixer circuitry, a first portion of another frequency-converted differential signal based on the first differential input signals and the fourth differential input signals, wherein generating the first portion of the other frequency-converted differential signal comprises generating, via the third mixer, the first portion of the other frequency-converted differential signal based on an inverse of the fourth differential input signals for the second mixer;
generating, via a fourth mixer of the second mixer circuitry, a second portion of the other frequency-converted differential signal based on the third differential input signals and the second differential input signals, wherein generating the second portion of the other frequency-converted differential signal comprises generating, via the fourth mixer, the second portion of the other frequency-converted differential signal based on an inverse of the second differential input signals for the first mixer; and providing the first portion and the second portion of the other frequency-converted differential signal to another load circuit.

16. The method of claim 15, wherein:
a phase of a first input signal of the second differential input signals lags a phase of a first input signal of the fourth differential input signals; and
a phase of a second input signal of the second differential input signals lags a phase of a second input signal of the fourth differential input signals.

17. The method of claim 15, wherein:
a phase of a first input signal of the second differential input signals leads a phase of a first input signal of the fourth differential input signals; and
a phase of a second input signal of the second differential input signals leads a phase of a second input signal of the fourth differential input signals.

18. The method of claim 15, wherein the first differential input signals and the third differential input signals are frequency converted to generate the frequency-converted differential signal, the second differential input signals and the fourth differential input signals comprising differential local-oscillator (LO) signals.

19. The method of claim 15, wherein the second differential input signals and the fourth differential input signals are frequency converted to generate the frequency-converted differential signal, the first differential input signals and the third differential input signals comprising differential local-oscillator (LO) signals.

20. The method of claim 15, wherein:
the first differential input signals and the third differential input signals comprise baseband (BB) signals and the second differential input signals and the fourth differential input signals comprise differential local-oscillator (LO) signals; or
the second differential input signals and the fourth differential input signals comprise BB signals and the first differential input signals and the third differential input signals comprise LO signals.

21. The method of claim 15, wherein the load circuit comprises a main load circuit and wherein the other load circuit comprises a dummy load circuit.

22. The method of claim 21, wherein the main load circuit comprises a drive amplifier (DA).

23. The method of claim 15, further comprising:
generating, via a fifth mixer of the first mixer circuitry, a third portion of the frequency-converted differential signal based on fifth differential input signals and sixth differential input signals;
generating, via a sixth mixer of the first mixer circuitry, a fourth portion of the frequency-converted differential signal based on seventh differential input signals and eighth differential input signals;
providing the third portion and the fourth portion of the frequency-converted differential signal to the load circuit;
generating, via a seventh mixer of the second mixer circuitry, a third portion of the other frequency-converted differential signal based on the fifth differential input signals and the eighth differential input signals;
generating, via an eighth mixer of the second mixer circuitry, a fourth portion of the other frequency-converted differential signal based on the seventh differential input signals and the sixth differential input signals; and providing the third portion and the fourth portion of the other frequency-converted differential signal to the other load circuit.

24. The method of claim 15, wherein the other load circuit comprises:
   a first capacitive element having a first terminal coupled to a first output of the second mixer circuitry; and
   a second capacitive element having a first terminal coupled to a second output of the second mixer circuitry.

25. The method of claim 24, wherein a node coupled to a second terminal of the first capacitive element and to a second terminal of the second capacitive element is electrically floating.

26. The method of claim 24, wherein the other load circuit further comprises an impedance element, the impedance element being coupled between a reference potential node and a node coupled to a second terminal of the first capacitive element and to a second terminal of the impedance element.

27. The method of claim 24, wherein:
   the method further comprises amplifying, via an amplifier, the frequency-converted differential signal, the amplifier having a first transistor coupled to a first output of the first mixer circuitry and a second transistor coupled to a second output of the first mixer circuitry;
   the first capacitive element has a first capacitance corresponding to a gate-to-source capacitance of the first transistor; and
   the second capacitive element has a second capacitance corresponding to a gate-to-source capacitance of the second transistor.

28. An apparatus for frequency conversion, comprising:
   means for generating a first portion of a frequency-converted differential signal based on first differential input signals and second differential input signals;
   means for generating a second portion of the frequency-converted differential signal based on third differential input signals and fourth differential input signals;
   means for combining the first portion and the second portion of the frequency-converted differential signal and providing the frequency-converted differential signal to a load circuit;
   means for generating a first portion of another frequency-converted differential signal based on the first differential input signals and the fourth differential input signals, wherein the means for generating the first portion of the other frequency-converted differential signal comprises means for generating the first portion of the other frequency-converted differential signal based on an inverse of the fourth differential input signals;
   means for generating, a second portion of the other frequency-converted differential signal based on the third differential input signals and the second differential input signals, wherein the means for generating the second portion of the other frequency-converted differential signal comprises means for generating the second portion of the other frequency-converted differential signal based on an inverse of the second differential input signals; and
   means for combining the first portion and the second portion of the other frequency-converted differential signal and providing the other frequency-converted differential signal to another load circuit.

* * * * *